(12) United States Patent
Liu et al.

(10) Patent No.: US 11,564,315 B2
(45) Date of Patent: Jan. 24, 2023

(54) FLEXIBLE CIRCUIT BOARD, DISPLAY PANEL, AND INSULATING FILM

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Di Liu, Shanghai (CN); Qiwen Zu, Shanghai (CN); Mingyan Huang, Shanghai (CN)

(73) Assignees: Wuhan Tianma Micro-Electronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 97 days.

(21) Appl. No.: 17/337,223

(22) Filed: Jun. 2, 2021

(65) Prior Publication Data
US 2022/0256696 A1    Aug. 11, 2022

(30) Foreign Application Priority Data
Feb. 10, 2021    (CN) .......................... 202110181150.7

(51) Int. Cl.
*H05K 1/18*      (2006.01)
*H05K 1/03*      (2006.01)

(52) U.S. Cl.
CPC ............. *H05K 1/036* (2013.01); *H05K 1/185* (2013.01); *H05K 1/189* (2013.01); *H05K 2201/0191* (2013.01); *H05K 2201/0195* (2013.01); *H05K 2201/10128* (2013.01)

(58) Field of Classification Search
CPC ........ H05K 1/036; H05K 1/185; H05K 1/189; H05K 2201/0191; H05K 2201/0195; H05K 2201/10128
See application file for complete search history.

(56) References Cited

U.S. PATENT DOCUMENTS

2014/0291621 A1*  10/2014  Kim .................... H01L 51/5237
                                                                257/40

FOREIGN PATENT DOCUMENTS

| CN | 208207435 U | 12/2018 |
| CN | 109852320 A | 6/2019 |
| WO | 2021003695 A1 | 1/2021 |

* cited by examiner

*Primary Examiner* — Binh B Tran
(74) *Attorney, Agent, or Firm* — Anova Law Group, PLLC (57) ABSTRACT

A flexible circuit board and a display panel are provided. The flexible circuit board includes a circuit board substrate layer, devices, a fluorinated-liquid solidification layer, and an insulating film. The devices are disposed on the circuit board substrate layer. Surfaces of the devices away from the circuit board substrate layer are covered with fluorinated liquid. The insulating film includes an insulating film substrate layer and a fluorine-containing adhesive layer. The fluorine-containing adhesive layer includes a resin adhesive and a fluorine-containing substance, and is in contact with the fluorinated liquid.

20 Claims, 5 Drawing Sheets

FLEXIBLE CIRCUIT BOARD, DISPLAY PANEL, AND INSULATING FILM

CROSS-REFERENCES TO RELATED APPLICATION

This application claims the priority of Chinese Patent Application No. 202110181150.7, filed on Feb. 10, 2021, the content of which is incorporated herein by reference in its entirety.

TECHNICAL FIELD

The present disclosure generally relates to the field of display technology and, more particularly, relates to a flexible circuit board, a display panel, and an insulating film.

BACKGROUND

With more and more functions of smart wearable projects, a Z-direction space of a whole device, that is, a height space requirement, is becoming smaller and smaller, such that it is required that a flexible circuit board device is not coated with a full sealant but with a fluorinated liquid to protect the device. In existing technologies, a flexible circuit board is usually formed by: dispense insulating adhesive around devices with a height not exceeding the height of the devices; spraying fluorinated liquid on surfaces of the devices; and then attaching an insulating film to the surfaces of the devices according to the design of the devices with an extension of 0.5 mm.

However, due to the space limitation of this structure, an area of the insulating film cannot be effectively attached to the surface of the flexible circuit board. Further, the fluorinated liquid will reduce the surface energy of the coating, causing the insulating film on the device to lift. The insulating film adhesive layer in the existing technologies is made of silica gel. The silica gel molecules and the fluorinated liquid coating are attracted to each other by weak van der Waals forces (intermolecular forces), resulting in poor adhesion of the insulating film with the fluorinated liquid coating.

SUMMARY

One aspect of the present disclosure provides a flexible circuit board. The flexible circuit board includes a circuit board substrate layer, devices, a fluorinated-liquid solidification layer, and an insulating film. The devices are disposed on the circuit board substrate layer. Surfaces of the devices away from the circuit board substrate layer are covered with fluorinated liquid. The insulating film includes an insulating film substrate layer and a fluorine-containing adhesive layer. The fluorine-containing adhesive layer includes a resin adhesive and a fluorine-containing substance, and is in contact with the fluorinated liquid.

Another aspect of the present disclosure provides a display panel. The display panel includes a flexible circuit board, a display surface, and a back surface opposite to the display surface. One end of the flexible circuit board may be connected to the display surface of the display panel, and another end of the flexible circuit board may be bent to the back surface of the display panel. The flexible circuit board includes a circuit board substrate layer, devices, a fluorinated-liquid solidification layer, and an insulating film. The devices are disposed on the circuit board substrate layer. Surfaces of the devices away from the circuit board substrate layer are covered with fluorinated liquid. The insulating film includes an insulating film substrate layer and a fluorine-containing adhesive layer. The fluorine-containing adhesive layer includes a resin adhesive and a fluorine-containing substance, and is in contact with the fluorinated liquid.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

A Z-direction space of a wearable device is required to become smaller and smaller, and flexible circuit boards are needed. The present disclosure provides a flexible circuit board. The flexible circuit board may include a circuit board substrate layer, devices, a fluorinated-liquid solidification layer, and an insulating film.

The devices may be disposed on the circuit board substrate layer, and surfaces of the devices away from the circuit board substrate layer may be covered with fluorinated liquid.

The insulating film may include an insulating film substrate layer and a fluorine-containing adhesive layer. The fluorine-containing adhesive layer may include a resin adhesive and a fluorine-containing substance. The fluorine-containing adhesive layer may be in contact with the fluorinated liquid.

Figure 1:
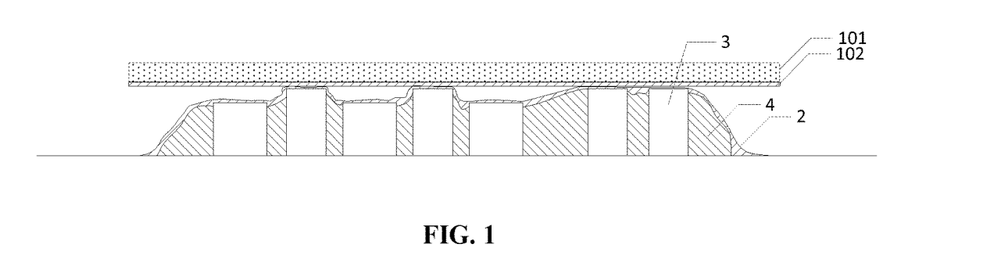
FIG. 1 illustrates an exemplary flexible circuit board consistent with various disclosed embodiments in the present disclosure.

FIG. 1 illustrates a flexible circuit board provided by one embodiment of the present disclosure. As shown in FIG. 1, the flexible circuit board may include an insulating film substrate layer 101, a fluorine-containing adhesive layer 102, a fluorinated-liquid solidification layer 2, devices 3, and an insulating adhesive 4.

In the present disclosure, the fluorine-containing substance may be added into the adhesive layer in contact with the fluorinated liquid, such that the fluorinated liquid and the adhesive layer may both include fluorine atoms. Since a fluorine atom may have high electronegativity. A fluorine atom may form an electrophilic "σ-hole" along the CF bond axis because of the effect of charge polarization, and at the same time form a nucleophilic band structure in a direction perpendicular to the CF bond axis. The "σ-hole" may interact with the nucleophilic regions in the surrounding molecules to form a fluorine bond, thereby increasing the bonding force between the insulating film and the fluorinated liquid. Correspondingly, the insulating film may stick on the devices, and may be not easier to fall off or warp, without increasing an area of the insulating film.

In one embodiment, the flexible circuit board may include a circuit board substrate layer.

Figure 2:
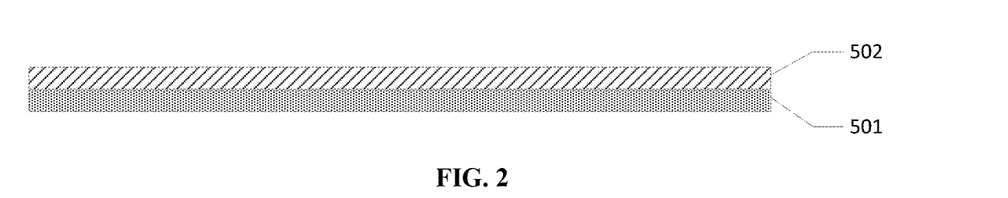
FIG. 2 illustrates an exemplary circuit board substrate layer consistent with various disclosed embodiments in the present disclosure.

As shown in FIG. 2 illustrating a circuit board substrate layer, in one embodiment, the flexible circuit board may be a single-layer flexible circuit board. As shown in FIG. 2, the circuit board substrate layer may include a flexible film layer 501 and a conductive film layer 502 disposed on the flexible film layer 501. The flexible film layer 501 may be preferably made of a polyimide film layer or a polyester film layer. A thickness of the flexible film layer 501 may preferably be about 25 μm to about 125 μm. The conductive film layer 502 may preferably be made of a copper foil layer, a copper-nickel alloy layer, or a conductive paint layer. The most commonly used and most economical conductive film layer in a flexible circuit board may be a copper foil layer. The copper foil layer may be an electrolytic copper foil layer or a calendared copper foil layer. The conductive paint layer may be made of conductive paint. The conductive paint may be a slurry composed of conductive materials (such as silver, carbon, etc.) mixed with a polymer adhesive (such as resin). A thickness of the conductive film layer 502 may be preferably about 5 μm to about 30 μm.

Figure 3:
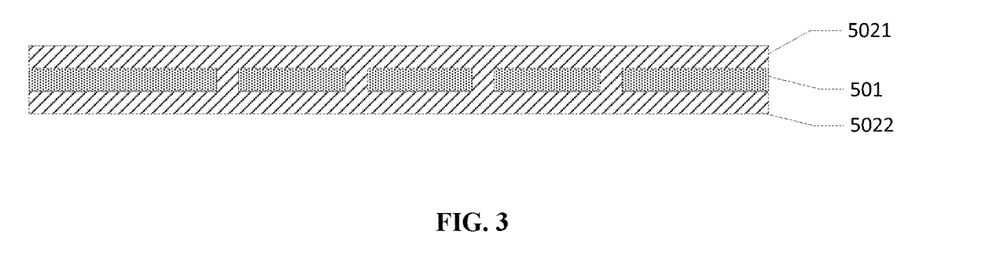
FIG. 3 illustrates another exemplary circuit board substrate layer consistent with various disclosed embodiments in the present disclosure.

In another embodiment shown in FIG. 3 illustrating another exemplary circuit board substrate layer, the flexible circuit board may be a bilayer flexible circuit board. As shown in FIG. 3, the circuit board substrate layer may include a flexible film layer 501, a first conductive film layer 5021 and a second conductive film layer 5022. The first conductive film layer 5021 and the second conductive film layer 5022 may be disposed at two sides of the flexible film layer 501 respectively. Through holes may be formed in the flexible film layer 501 and the through holes may be filled with a conductive medium. The first conductive film layer 5021 and the second conductive film layer 5022 may form a conductive path through the conductive medium in the through holes. The flexible film layer 501 may be preferably a polyimide film layer or a polyester film layer, and a thickness of the flexible film layer 501 may be preferably about 25 μm to about 125 μm. The conductive medium filled in the through holes may have a type same as or different from types of the first conductive film layer 5021 and the second conductive film layer 5022. Each of the first conductive film layer 5021 and the second conductive film layer 5022 may be configured independently and preferably as a copper foil layer, a copper-nickel alloy layer, or a conductive paint layer. The most commonly used and most economical conductive film layer in a flexible circuit board may be a copper foil layer. The copper foil layer can be an electrolytic copper foil layer or a calendared copper foil layer. The conductive paint layer may be made of conductive paint. The conductive paint may be a slurry composed of conductive materials (such as silver, carbon, etc.) mixed with a polymer adhesive (such as resin). A thickness of the first conductive film layer 5021 and a thickness of the second conductive film layer 5022 may be independently and preferably configured to about 5 μm to about 30 μm.

Figure 4:
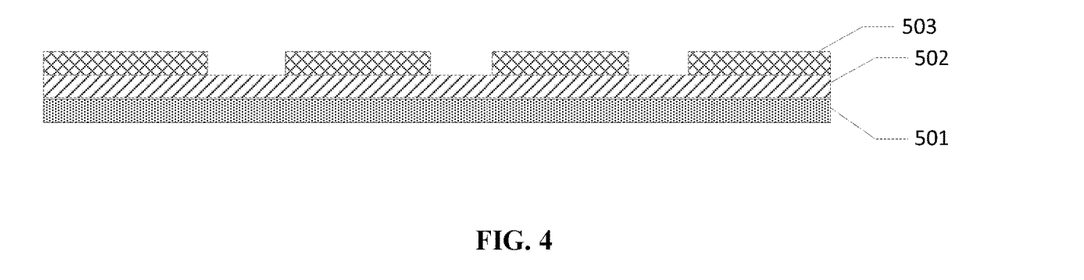
FIG. 4 illustrates another exemplary circuit board substrate layer consistent with various disclosed embodiments in the present disclosure.
Figure 5:
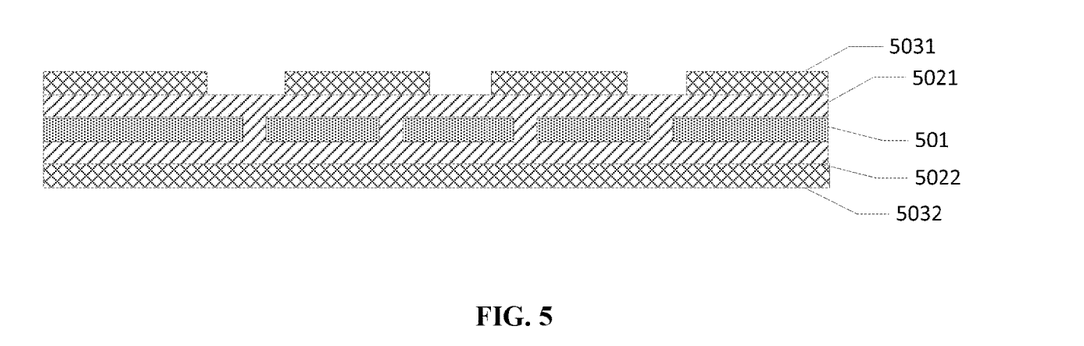
FIG. 5 illustrates another exemplary circuit board substrate layer consistent with various disclosed embodiments in the present disclosure.

In one embodiment, the circuit board substrate layer may preferably further include a discontinuous insulating covering layer, as shown in FIG. 4. In the present embodiment, the circuit board substrate layer in FIG. 4 may include a flexible film layer 501, a conductive film layer 502, and a discontinuous insulating covering layer 503. In another embodiment, the flexible circuit board may be a bilayer flexible circuit board. Correspondingly, a discontinuous insulating covering layer may be disposed at a side of the circuit board substrate layer, and a continuous insulating covering layer may be disposed at another side of the circuit board substrate layer. As shown in FIG. 5, the circuit board substrate layer in the present embodiment may include a flexible film layer 501, a first conductive film layer 5021, a second conductive film layer 5022, a discontinuous insulating covering film layer 5031, and a continuous insulating covering layer 5032. A thickness of the discontinuous insulating covering layer and a thickness of the continuous insulating covering layer may be configured independently and preferably to about 5 μm to about 30 μm.

Devices may be disposed at the circuit board substrate layer, and may be in contact with the conductive film layer on the circuit board substrate layer. All devices in the flexible circuit board may form a complete conductive path through the conductive film layer.

Figure 6:
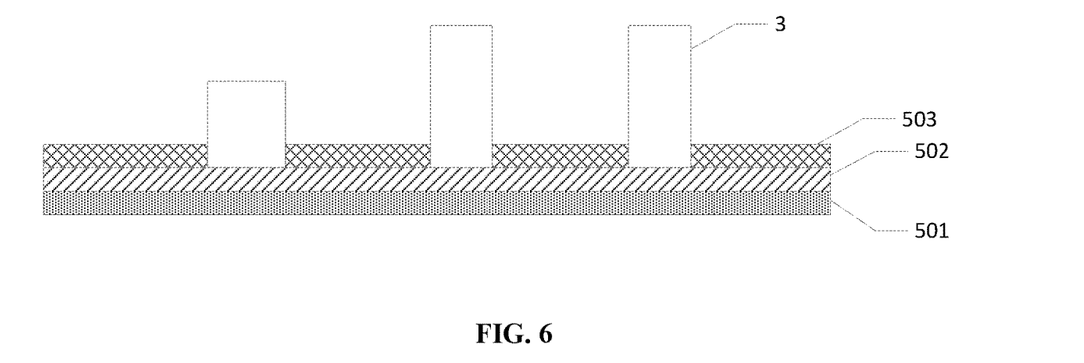
FIG. 6 illustrates an exemplary single-layer flexible circuit board with a device formed on the circuit board substrate layer, consistent with various disclosed embodiments in the present disclosure.

In one embodiment in FIG. 6, the flexible circuit board may be a single layer flexible circuit board, and correspondingly, the flexible circuit board may include devices 3, a flexible film layer 501, a conductive film layer 502, and a discontinuous insulating covering layer 503.

Figure 7:
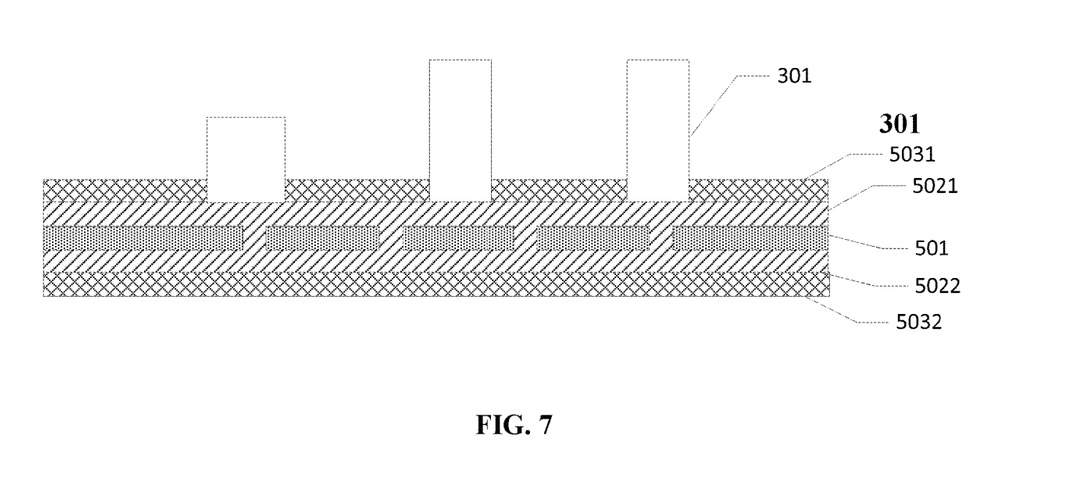
FIG. 7 illustrates an exemplary bilayer flexible circuit board with a device formed on the circuit board substrate layer, consistent with various disclosed embodiments in the present disclosure.

In another embodiment in FIG. 7, the flexible circuit board may be a bilayer flexible circuit board, and correspondingly, the flexible circuit board may include devices 301, a flexible film layer 501, a first conductive film layer 5021, a second conductive layer 5022, a discontinuous insulating covering layer 5031, and a continuous insulating covering layer 5032. The through holes filled with the conductive medium at the flexible film layer may be preferably located at positions in the flexible film layer corresponding to the devices.

In the present disclosure, a quantity of the devices is preferably greater than or equal to 2. To further protect the devices and improve the insulation between the devices, insulating adhesive may be preferably disposed between adjacent devices, and the height of the insulating adhesive may not exceed the height of the devices, and preferably may not exceed the height of the adjacent devices. More preferably when there is a height difference between adjacent devices, the surface of the insulating adhesive between the adjacent devices may form a gentle slope, such that sides of the adjacent devices may be covered by the insulating glue. By filling the space between the adjacent devices with the insulating glue, the contact area between the fluoride liquid and the fluorine-containing adhesive layer may be increased, to further improve the bonding force between the fluoride liquid and the fluorine-containing adhesive layer. The material of the insulating adhesive and the insulating covering layers may be same or different. When the material of the insulating adhesive and the insulating covering layers may be same, the insulating adhesive and the insulating covering layers may be formed as a whole.

Figure 8:
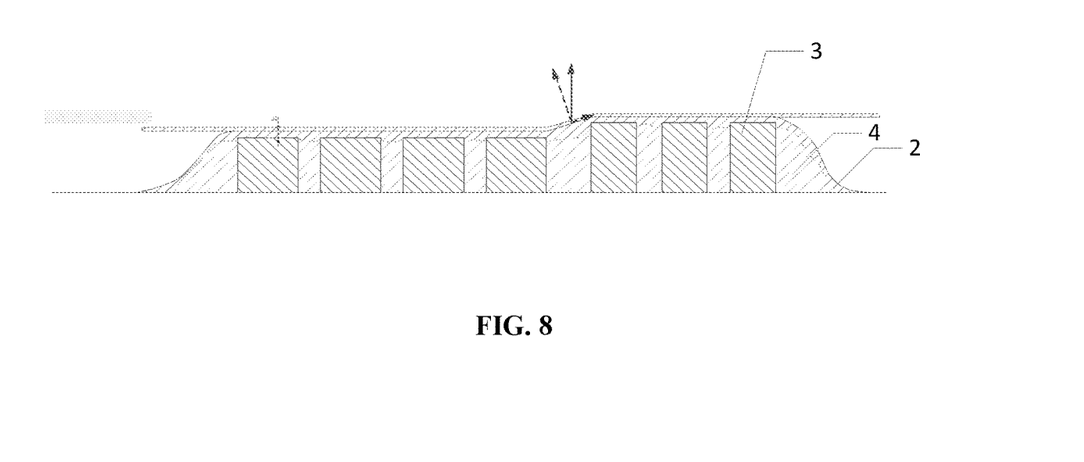
FIG. 8 illustrates an exemplary force analysis of a flexible circuit board consistent with various disclosed embodiments in the present disclosure.
Figure 9:
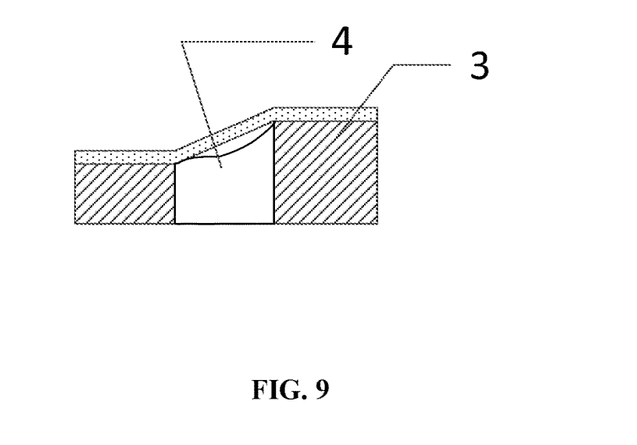
FIG. 9 illustrates an exemplary cavity structure formed by an insulating film and an insulating glue, consistent with various disclosed embodiments in the present disclosure.

When the quantity of devices in the flexible circuit board is greater than or equal to 2, because different devices have different heights, the surface of the insulating film may appear inclined, as shown in FIG. 8. From the perspective of stress analysis, when the insulating film is in full contact with the fluoride liquid with an ideal bonding, a force applied on the insulating film at the slope may be divided into horizontal and vertical components. When the θ of the slope is greater, the force required for the insulating film to be peeled off should be larger. However, when the slope is too large, the insulating adhesive may easily flow down the slope, causing the insulating adhesive to accumulate at the bottom and create cavities at the top. Correspondingly, the contact area may be reduced, and the fluoride liquid on the insulating film and the insulating adhesive cannot be completely contacted, as shown in FIG. 9. It may be easier to cause peeling. Since the height difference h of the device is fixed, it is preferable to reduce the slope of the inclined surface between the adjacent devices by increasing the distance between adjacent devices. The slope of the slope is formed. The length of the slope where the insulating film and the fluoride liquid are in contact may be h/tan θ, and the slope θ may be reduced, such that the length of the slope can be increased to increase the adhesion. In the present disclosure, the distance between the devices may be configured preferably such that the slope formed by the height and the horizontal distance between adjacent devices is less than or equal to 20° to reduce device fluctuations.

Increasing the distance between adjacent devices may increase the area of the flexible circuit board. Therefore, in the present disclosure, the flexible circuit board may preferably include a first device installation area and a second device installation area. Height of a portion of the devices in the first device installation area may be about 0.8H1 to about 1.2H1, and height of a remaining portion of the devices in the second device installation area may be about 0.8H2 to about 1.2H2 where H2>1.5H1. Through the adjustment of the device distribution, the devices of similar height may be arranged together, which is beneficial to the uniformity of the insulating adhesive dispensing. At the same time, the gap between the high devices and the low devices is enlarged, such that the dispensing slope of the insulating adhesive may be below 20°. Correspondingly, the height difference of the high and low devices may be transitioned through the slope of the insulating glue, facilitating contact with the insulating film.

Figure 10:
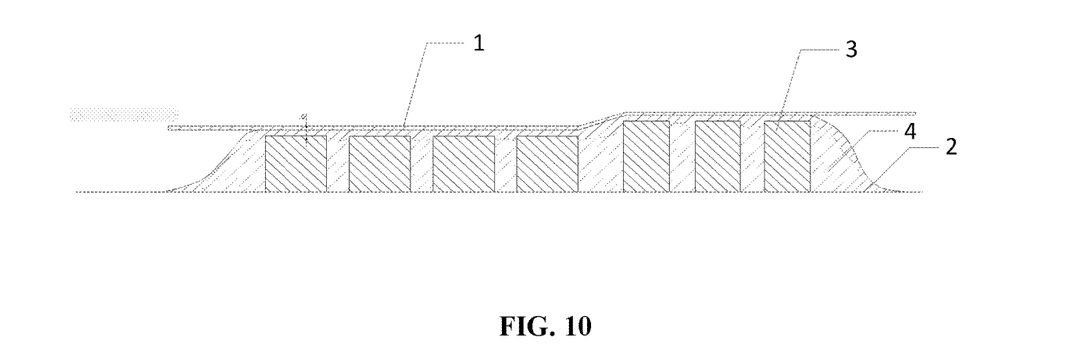
FIG. 10 illustrates a local view of an exemplary flexible circuit board consistent with various disclosed embodiments in the present disclosure.

The surface of the devices away from the circuit board substrate layer may be covered with a fluoride liquid. Preferably, the surface of the insulating adhesive may be also covered with a fluoride liquid, and may be connected to the fluoride liquid on the surface of the devices to form a fluoride liquid layer. The arrangement of the insulating adhesive may allow the fluoride liquid to form a whole layer structure covering the surface of the devices and the insulating glue, such that the connection with the fluorine-containing adhesive layer may change from point contact to surface contact, thereby improving the bonding force between the fluorine-containing adhesive layer and the insulating glue. Referring to FIG. 10, FIG. 10 is a schematic diagram of a part of the structure of a flexible circuit board provided by the present disclosure. In FIG. 10, 1 denotes the insulating film, 2 denotes the fluorinated-liquid solidification layer, 3 denotes the devices, and 4 denotes the insulating glue. The thickness of the fluorinated-liquid solidification layer preferably may be configured to about 10 μm to about 30 μm, more preferably about 15 μm to about 25 μm, and even more preferably to about 20 μm. After the insulating adhesive is filled, there may be a jagged contour between the devices, and the fluorinated-liquid solidification layer can fill the jagged contour, thereby increasing the effective attachment area of the insulating film.

Figure 11:
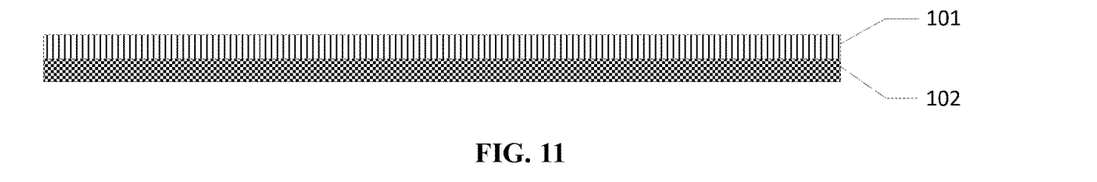
FIG. 11 illustrates an exemplary insulating film consistent with various disclosed embodiments in the present disclosure.

The fluorinated-liquid solidification layer may be in contact with the insulating film. As shown in FIG. 11, the insulating film may include an insulating film substrate layer 101 and a fluorine-containing adhesive layer 102. A thickness of the fluorine-containing adhesive layer may be preferably configured to about 5 μm to about 10 μm. The fluorine-containing adhesive layer may include resin adhesive and a fluorine-containing substance; and may be in contact with the fluorinated liquid. The fluorine-containing substance may contain fluorine atoms, such that in addition to the mutual attraction and connection between the fluorine-containing adhesive layer and the fluoride liquid, a fluorine bond may be also formed (the interaction between the fluorine atoms of the fluorine-containing substance and the fluorine atoms in the fluoride liquid). Therefore, the adhesion between the fluorine-containing adhesive layer and the fluoride liquid may be improved, and the insulating film may be firmly bonded.

Specifically, the fluorine-containing substance and the resin adhesive may both contain hydroxyl groups. The fluorine-containing substance and the resin adhesive may be bonded through condensation of the hydroxyl groups, thereby improving the bonding of the fluorine-containing adhesive layer as a whole.

Specifically, the mass of the fluorine-containing substance in the fluorine-containing adhesive layer may be preferably about 1% to about 10% of the mass of the resin adhesive.

Specifically, the fluorine-containing material may be preferably one or more of fluorine-containing polymer material, fluorinated graphene, or oxidized fluorinated graphene. When the content of the fluorine-containing polymer is too small, too few fluorine bonds may be formed resulting too small bonding force. When the content of the fluorine-containing substance is too large, will affect the adhesion properties of the resin adhesive. Preferably, the resin adhesive may include one or more of fluorinated epoxy resin, fluorinated hydroxy acrylate, or FEVE resin. In the present disclosure, most preferably, the fluorine-containing substance may be oxidized fluorinated graphene formed by oxidizing fluorinated graphene.

Figure 12:
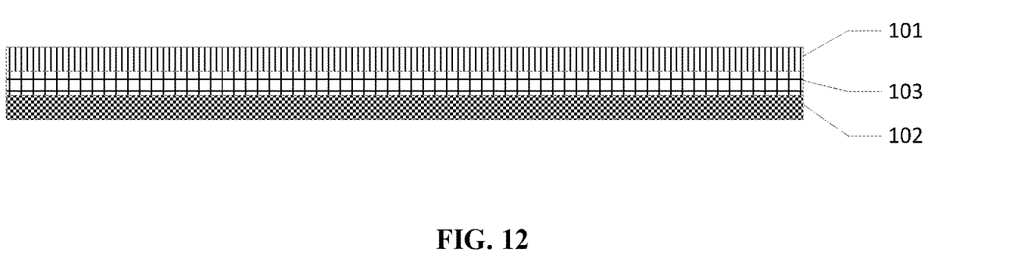
FIG. 12 illustrates an exemplary insulating film including a resin adhesive layer consistent with various disclosed embodiments in the present disclosure.
Figure 13:
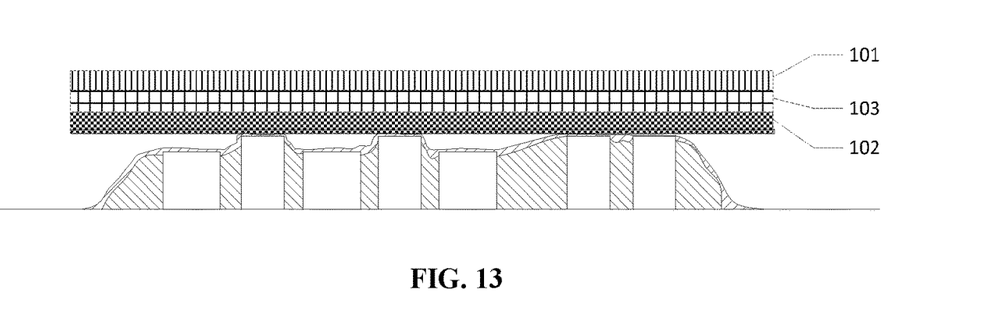
FIG. 13 illustrates another exemplary flexible circuit board consistent with various disclosed embodiments in the present disclosure.

In one embodiment of the present disclosure, the insulating film may preferably further include a resin adhesive layer located between the insulating film substrate layer and the fluorine-containing adhesive layer. As illustrated in FIG. 12 showing a schematic diagram of the structure of the insulating film including the resin adhesive layer and FIG. 13 showing a schematic diagram of the structure of the flexible circuit board, the flexible circuit board may include an insulating film substrate layer 101, a fluorine-containing adhesive layer 102, a resin adhesive layer 103, fluorinated liquid 2, devices 3, and an insulating adhesive 4. A thickness of the resin adhesive layer may be preferably about 10 μm to about 30 μm. By dividing the adhesive layer in the insulating film layer into a resin adhesive layer and a fluorine-containing adhesive layer, when the insulating film needs to be removed based on testing, rework, analysis, etc., since the bond energy of the fluorine bond is greater than other intermolecular force, the fluorine-containing adhesive layer may be kept on the fluorinated liquid when the insulating film is removed, thereby protecting the fluorinated liquid on the surface of the devices from being peeled off by adhesion.

Specifically, the resin adhesive layer may be made of a resin adhesive. The resin adhesive preferably may contain hydroxyl groups. More preferably, the resin adhesive may be an acrylic adhesive.

The present disclosure also provides a display panel. The display panel may include any flexible circuit board provided by various embodiments of the present disclosure.

In one embodiment, the display panel may include a display surface and a back surface opposite to the display device. One end of the flexible circuit board may be connected to the display surface of the display panel, and another end of the flexible circuit board may be bent to the back surface of the display panel.

The present disclosure also provides an insulating film. As shown in FIG. 11, the insulating film may include an insulating film substrate layer 101 and a fluorine-containing adhesive layer 102. A thickness of the fluorine-containing adhesive layer may be preferably configured to about 5 μm to about 10 μm. The fluorine-containing adhesive layer may include resin adhesive and a fluorine-containing substance; and may be in contact with the fluorinated liquid. The fluorine-containing substance may contain fluorine atoms, such that in addition to the mutual attraction and connection between the fluorine-containing adhesive layer and the fluoride liquid, a fluorine bond may be also formed (the interaction between the fluorine atoms of the fluorine-containing substance and the fluorine atoms in the fluoride liquid). Therefore, the adhesion between the fluorine-containing adhesive layer and the fluoride liquid may be improved, and the insulating film may be firmly bonded.

Specifically, the mass of the fluorine-containing substance in the fluorine-containing adhesive layer may be preferably about 1% to about 10% of the mass of the resin adhesive. When the content of the fluorine-containing polymer is too small, too few fluorine bonds may be formed resulting too small bonding force. When the content of the fluorine-containing substance is too large, will affect the adhesion properties of the resin adhesive.

Specifically, the fluorine-containing material may preferably include one or more of fluorine-containing polymer material, fluorinated graphene, or oxidized fluorinated graphene. Preferably, the fluorine-containing polymer material may be one or more of fluorinated epoxy resin, fluorinated hydroxy acrylate, or FEVE resin. In the present disclosure, most preferably, the fluorine-containing substance may be oxidized fluorinated graphene formed by oxidizing fluorinated graphene. Fluorine-containing polymer, fluorinated graphene and oxidized fluorinated graphene may all have good weather resistance and corrosion resistance, such that they can increase the adhesion of the insulating film and the fluorinated liquid, and also improve the weather resistance and the corrosion resistance of the insulating film. Correspondingly, the weather resistance and corrosion resistance of the flexible circuit board may be improved, and its service life in vehicle display panels, outdoor large screens, and wearable devices may be improved.

In one embodiment of the present disclosure, the insulating film may preferably further include a resin adhesive layer located between the insulating film substrate layer and the fluorine-containing adhesive layer. As illustrated in FIG. 12 showing a schematic diagram of the structure of the insulating film including the resin adhesive layer, the insulating film may include an insulating film substrate layer 101, a fluorine-containing adhesive layer 102, and a resin adhesive layer 103. A thickness of the resin adhesive layer may be preferably about 10 μm to about 30 μm. By dividing the adhesive layer in the insulating film layer into a resin adhesive layer and a fluorine-containing adhesive layer, when the insulating film needs to be removed based on testing, rework, analysis, etc., since the bond energy of the fluorine bond is greater than other intermolecular force, the fluorine-containing adhesive layer may be kept on the fluorinated liquid when the insulating film is removed, thereby protecting the fluorinated liquid on the surface of the devices from being peeled off by adhesion.

Specifically, the resin adhesive layer may be made of a resin adhesive. The resin adhesive preferably may contain hydroxyl groups. More preferably, the resin adhesive may be an acrylic adhesive.

To make the insulating film be able to be removed easily when the flexible circuit board is in use, the area of the insulating film may preferably be configured to be larger than the area of the device area, and a region between the portion of the insulating adhesive that exceeds the device area and the circuit board substrate layer may be filled with soluble glue. The soluble adhesive can be dissolved by heat, light or solvent to form edge defects that are easy to peel off.

Figure 14:
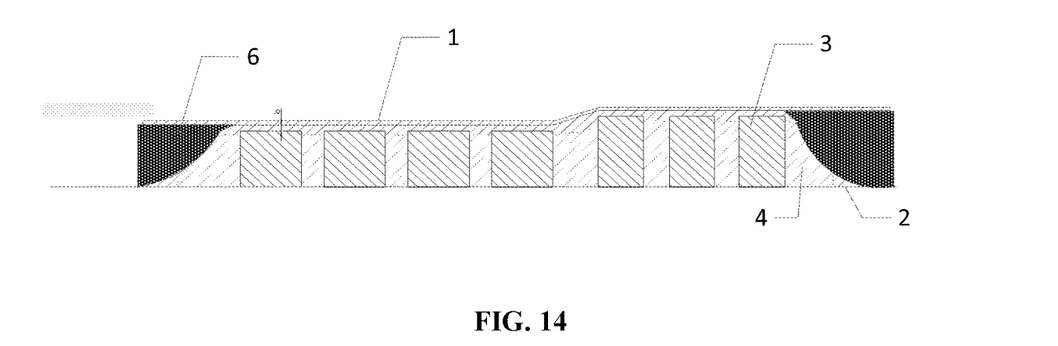
FIG. 14 illustrates another exemplary flexible circuit board consistent with various disclosed embodiments in the present disclosure.

To avoid exposing the devices and affecting the performance of the device after the soluble adhesive dissolves, the outer edge of the device area may be preferably provided with insulating adhesive to wrap the sides of the devices, and the insulating adhesive may form slopes at the edges. And regions between the slopes and the insulating film may be filled with soluble glue. As shown in FIG. 14, 1 denotes the insulating film, 2 denotes the fluorinated-liquid solidification layer, 4 denotes the insulating glue, and 6 denotes the soluble glue.

Further, the edges of the soluble adhesive may preferably be configured to extend beyond the edges of the insulating film to avoid defects when it is not reworked or removed.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A flexible circuit board, comprising a circuit board substrate layer, devices, a fluorinated-liquid solidification layer, and an insulating film, wherein:
    the devices are disposed on the circuit board substrate layer;
    surfaces of the devices away from the circuit board substrate layer are covered with a fluorinated liquid;
    the insulating film includes an insulating film substrate layer and a fluorine-containing adhesive layer;
    the fluorine-containing adhesive layer includes a resin adhesive and a fluorine-containing substance; and
    the fluorine-containing adhesive layer is in contact with the fluorinated liquid.

2. The flexible circuit board according to claim 1, wherein:
    the fluorine-containing substance and the resin adhesive both contain hydroxyl groups; and
    the fluorine-containing substance and the resin adhesive are bonded by condensation of the hydroxyl groups.

3. The flexible circuit board according to claim 1, wherein the fluorine-containing substance includes one or more of fluorine-containing polymer substance, fluorinated graphene, or oxidized fluorinated graphene.

4. The flexible circuit board according to claim 2, wherein:
    the fluorine-containing polymer substance includes one or more of fluorinated epoxy resin, fluorinated hydroxy acrylate, or fluor olefin-vinyl ether copolymer.

5. The flexible circuit board according to claim 1, wherein the fluorine-containing substance includes oxidized fluorinated graphene.

6. The flexible circuit board according to claim 1, wherein:
    the insulating film further includes a resin adhesive layer; and
    the resin adhesive layer is located between the insulating film substrate layer and the fluorine-containing adhesive layer.

7. The flexible circuit board according to claim 6, wherein the resin adhesive layer is made of a resin adhesive and the resin adhesive contains hydroxyl groups.

8. The flexible circuit board according to claim 1, wherein:
    a quantity of the devices is larger than or equal to 2; and
    a slope between a height difference and a horizontal distance of two adjacent devices of the devices is smaller than or equal to 20°.

9. The flexible circuit board according to claim 8, further including a first device installation area and a second device installation area, wherein:
    a portion of the device is arranged in the first device installation area and one of other portions of the device is arranged in the second device installation area;
    a height of the portion of the device in the first device installation area is between about 0.8H1 and about 1.2H1; and
    a height of the remaining portion of the device in the second device installation area is between about 0.8H2 and about 1.2H2 where H2>1.5H1.

10. The flexible circuit board according to claim 8, wherein:
    an insulating adhesive is disposed between the devices;
    a height of the insulating adhesive does not exceed a height of the devices;
    the insulating adhesive is covered with the fluorinated liquid; and
    the fluorinated liquid on the insulating adhesive is connected to the fluorinated liquid on the surfaces of the devices, to form the fluorinated-liquid solidification layer.

11. A display panel, comprising a flexible circuit board, a display surface, and a back surface opposite to the display surface, wherein:
    one end of the flexible circuit board may be connected to the display surface of the display panel, and another end of the flexible circuit board may be bent to the back surface of the display panel; and
    the flexible circuit board includes a circuit board substrate layer, devices, a fluorinated-liquid solidification layer, and an insulating film, wherein:
        the devices are disposed on the circuit board substrate layer;
        surfaces of the devices away from the circuit board substrate layer are covered with fluorinated liquid;
        the insulating film includes an insulating film substrate layer and a fluorine-containing adhesive layer;
        the fluorine-containing adhesive layer includes a resin adhesive and a fluorine-containing substance; and
        the fluorine-containing adhesive layer is in contact with the fluorinated liquid.

12. The display panel according to claim 11, wherein:
    the fluorine-containing substance and the resin adhesive both contain hydroxyl groups; and
    the fluorine-containing substance and the resin adhesive are bonded by condensation of the hydroxyl groups.

13. The display panel according to claim 11, wherein the fluorine-containing substance includes one or more of fluorine-containing polymer substance, fluorinated graphene, or oxidized fluorinated graphene.

14. The display panel according to claim 12, wherein:
    the fluorine-containing polymer substance includes one or more of fluorinated epoxy resin, fluorinated hydroxy acrylate, or fluor olefin-vinyl ether copolymer.

15. The display panel according to claim 11, wherein the fluorine-containing substance includes oxidized fluorinated graphene.

16. The display panel according to claim 11, wherein:
    the insulating film further includes a resin adhesive layer; and the resin adhesive layer is located between the insulating film substrate layer and the fluorine-containing adhesive layer.

17. The display panel according to claim 16, wherein the resin adhesive layer is made of a resin adhesive and the resin adhesive contains hydroxyl groups.

18. The display panel according to claim 11, wherein:
a quantity of the devices is larger than or equal to 2; and
a slope between a height difference and a horizontal distance of two adjacent devices of the devices is smaller than or equal to 20°.

19. The display panel according to claim 18, further including a first device installation area and a second device installation area, wherein:
a portion of the device is arranged in the first device installation area and a remaining portion of the device is arranged in the second device installation area;
a height of the portion of the device in the first device installation area is between about 0.8H1 and about 1.2H1; and
a height of the remaining portion of the device in the second device installation area is between about 0.8H2 and about 1.2H2 where H2>1.5H1.

20. The display panel according to claim 18, wherein:
an insulating adhesive is disposed between the devices;
a height of the insulating adhesive does not exceed a height of the devices;
the insulating adhesive is covered with the fluorinated liquid; and
the fluorinated liquid on the insulating adhesive is connected to the fluorinated liquid on the surfaces of the devices, to form the fluorinated-liquid solidification layer.

* * * * *